United States Patent
Jeong et al.

(10) Patent No.: US 7,606,064 B2
(45) Date of Patent: Oct. 20, 2009

(54) METHOD FOR REDUCING A RESET CURRENT FOR RESETTING A PORTION OF A PHASE CHANGE MATERIAL IN A MEMORY CELL OF A PHASE CHANGE MEMORY DEVICE AND THE PHASE CHANGE MEMORY DEVICE

(75) Inventors: Chang-Wook Jeong, Seoul (KR); Jun-Hyok Kong, Seoul (KR); Ji-Hye Yi, Yongin-si (KR); Beak-Hyung Cho, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 310 days.

(21) Appl. No.: 11/420,933

(22) Filed: May 30, 2006

(65) Prior Publication Data

US 2006/0215435 A1    Sep. 28, 2006

(51) Int. Cl.
*G11C 11/00* (2006.01)
(52) U.S. Cl. .................. 365/163; 365/148; 365/46; 257/2; 438/95; 438/166
(58) Field of Classification Search .............. 365/148, 365/163; 257/2–5; 438/95–96, 166.365, 438/482, 486, 597
See application file for complete search history.

(56) References Cited

U.S. PATENT DOCUMENTS

| 5,296,716 | A | * | 3/1994 | Ovshinsky et al. .......... 257/3 |
| 5,341,328 | A | * | 8/1994 | Ovshinsky et al. ......... 365/163 |
| 5,596,522 | A |   | 1/1997 | Ovshinsky et al. |
| RE37,259 | E | * | 7/2001 | Ovshinsky ............ 365/163 |
| 6,410,117 | B1 | * | 6/2002 | Chin et al. ............ 428/64.1 |
| 2002/0041947 | A1 | * | 4/2002 | Chin et al. ............ 428/64.4 |
| 2005/0002227 | A1 |   | 1/2005 | Hideki et al. |
| 2005/0029502 | A1 |   | 2/2005 | Hudgens |
| 2005/0036364 | A1 |   | 2/2005 | Ha et al. |
| 2005/0052904 | A1 |   | 3/2005 | Cho et al. |

FOREIGN PATENT DOCUMENTS

| JP | 2005-093619 | 4/2005 |
| KR | 10-2004-0076225 | 8/2004 |
| KR | 10-2005-0025730 | 3/2005 |
| KR | 10-2005-0085533 | 8/2005 |
| KR | 10-2006-0016312 | 2/2006 |
| KR | 1020050099589 | 10/2006 |

OTHER PUBLICATIONS

Ovonyx Technical Presentation, Mar. 2, 2001 (unless noted).*
English Translation of Korean Office Action dated Jun. 25, 2007.
English Translation of Office Action for corresponding Korean Application No. 10-2006-0050566 dated Dec. 26, 2007.
Decision of Grant for corresponding Korean Application No. 10-2006-0050566 dated Sep. 4, 2008.
Office Action issued on May 8, 2009 in the corresponding Chinese Patent application No. 200710104174.2.

* cited by examiner

*Primary Examiner*—Son Dinh
*Assistant Examiner*—Harry W Byrne
(74) *Attorney, Agent, or Firm*—Harness, Dickey & Pierce, P.L.C.

(57) ABSTRACT

According to one embodiment, at least a portion of the phase change material including a first crystalline phase is converted to one of a second crystalline phase and an amorphous phase. The second crystalline phase transitions to the amorphous phase more easily than the first crystalline phase. For example the first crystalline phase may be a hexagonal closed packed structure and the first crystalline phase may be a face centered cubic structure.

22 Claims, 13 Drawing Sheets

METHOD FOR REDUCING A RESET CURRENT FOR RESETTING A PORTION OF A PHASE CHANGE MATERIAL IN A MEMORY CELL OF A PHASE CHANGE MEMORY DEVICE AND THE PHASE CHANGE MEMORY DEVICE

This application claims priority of U.S. application Ser. No. 10/929,511 filed Aug. 30, 2004, the entire contents of which are hereby incorporated by reference in their entirety.

FOREIGN PRIORITY INFORMATION

This application claims the priority of Korean Patent Application No. 2003-62546, filed on Sep. 8, 2003, in the Korean Intellectual Property Office, the contents of which are incorporated herein in their entirety by reference.

BACKGROUND OF THE INVENTION

1. Field of the Invention

The present invention relates to a method for reducing a reset current for resetting a portion of a phase change material in a memory cell of a phase change memory device and a phase change memory device.

2. Description of the Related Art

FIG. 1 illustrates a prior art structure of a phase change memory cell. As shown, a lower insulating layer 102 is formed over a substrate 100. A first contact hole 105 is formed in the lower insulating layer 102, and a lower electrode 113 (sometimes referred to as a heater) is formed in the first contact hole 105. Typically the lower electrode 113 is formed of TiAlN, TiN, etc. A phase change material 115 is formed on the lower insulating layer 102 over the lower electrode 113. Typically, the phase change material is a chalcogenide material such as $Ge_2Sb_2Te_5$, etc. An upper electrode 119 is formed on the phase change material 115. The upper electrode 119 may be formed from TiN, TaN, WN, etc. An upper insulating layer 122 is formed over the substrate 100. A second contact hole 125 is formed in the upper insulating layer 122 to expose a portion of the upper electrode 119. A conductive plug 127 is formed in the second contact hole 125. The conductive plug 127 may be formed of W, Al, Cu, etc. A metal pattern 129 (e.g., conductive line) may then be formed over the upper insulating layer 122 in contact with the plug 127. The metal pattern may be formed of the same material as the plug 127. Typically, the metal pattern 129 is a bitline of the phase change memory device including the phase change memory cell of FIG. 1.

The memory cell of FIG. 1 is programmable based on the application of heat to the phase change material 115. The application of heat may be performed by passing a current through the phase change material 115 (e.g., by applying current to the upper electrode 119). FIG. 2A illustrates both the current reset pulse and current set pulse for programming the phase change material 115. As shown in FIG. 2A, the reset pulse is a high current supplied for short period of time, while the set pulse is a lower current for a longer period of time. As shown in FIG. 2B, the reset pulse has the effect of increasing the resistance of the phase change material 115, while the set pulse has the effect of lowering the resistance of the phase change material 115. The change in resistance is brought about by a change in the state of the phase change material 115. The reset pulse causes a programmable volume of the phase change material 115, such as shown in FIG. 3, to become amorphous. By contrast, the set pulse causes the programmable volume of the phase material 115 to become crystalline. The higher resistance amorphous state generally corresponds to the storage of a logic "one," while the lower resistance crystalline state corresponds to the storage of a logic "zero".

To maintain low power consumption, it is desirable for both the reset current and the set current to be relatively low. However, it is also desirable that the resulting resistance of the phase change material as a result of the reset operation have as large a difference as possible with respect to the resistance of the phase change material after the set operation. Generally, as the reset current is reduced, the difference in resistivity between the reset and set states diminishes. Thus, an unfavorable tradeoff exists between trying to achieve low set and reset currents, while also maintaining a desirable difference in the set and reset resistances.

SUMMARY OF THE INVENTION

The present invention provides a method of reducing reset current for resetting a portion of phase change material in a memory cell of a phase change memory device.

According to at least one embodiment, at least a portion of the phase change material including a first crystalline phase is converted to one of a second crystalline phase and an amorphous phase. The second crystalline phase transitions to the amorphous phase more easily than the first crystalline phase. For example, the first crystalline phase may be a hexagonal closed packed structure, and the second crystalline phase may be a face centered cubic structure.

In one embodiment, the converting is performed through heat treatment. For example, a rapid thermal annealing at a temperature greater than a melting temperature of the phase change material may be performed to convert the first crystalline phase to the amorphous phase.

According to another embodiment, the heat treatment may include baking the phase change memory device for a period of time at a temperature below the melting temperature of the phase change material in order to convert the first crystalline phase to the second crystalline phase.

In another embodiment of the present invention, the converting step is achieved by applying a current to the phase change material. For example, the applied current is greater than the reset current if the converting step was not performed. As a more specific example the applied current may be 1.1 times the reset current if the converting step was not performed. In another embodiment of the present invention, the application of current is performed after baking of the phase change memory device as discussed above.

In another embodiment of the present invention the reduction of reset current is obtained by converting at least a portion of the phase change material in a mixed phase state to a single phase state. For example, at least a portion of the phase change material in a mixed crystalline phase state is changed to a single phase state. The phase state may be an amorphous phase, or may be a single crystalline phase.

The present invention is also directed to a phase change memory device.

In one embodiment, the phase change memory device includes a upper electrode, a lower electrode, and phase change material disposed between the upper and lower electrode. The phase change material may be entirely in a single phase, and the single phase may be one of an amorphous phase and a face centered cubic phase.

In another embodiment, the phase change material includes a lower portion in contact with the lower electrode and a remaining portion. The lower portion may be one of a first crystalline phase and an amorphous phase. The remaining portion includes at least a second crystalline phase. The first crystalline phase transitions to the amorphous phase more easily than the second crystalline phase.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein.

DETAILED DESCRIPTION OF EXAMPLE EMBODIMENTS INVENTION

Figure 1:
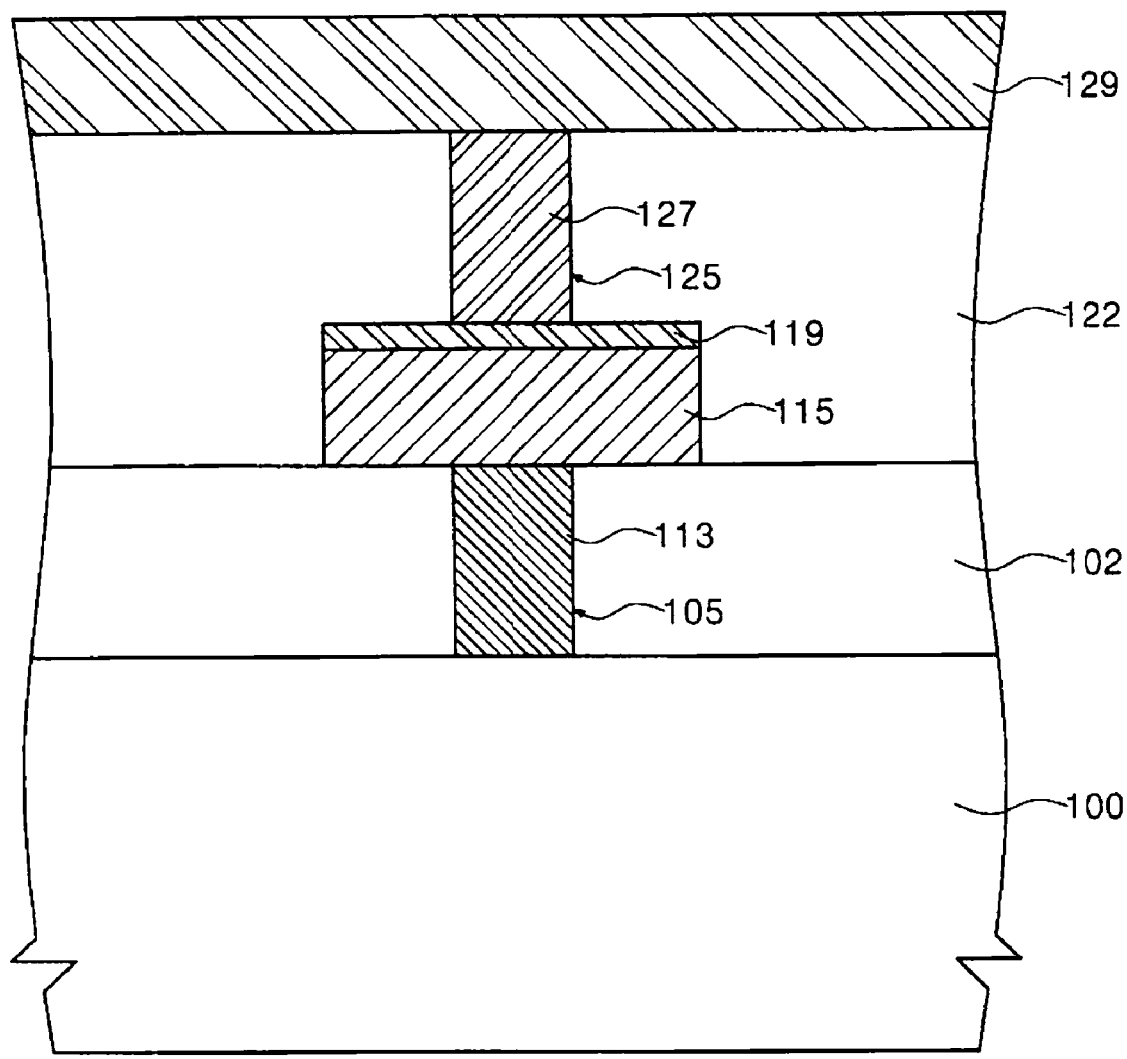
FIG. 1 illustrates a structure of a prior art phase change memory cell.
Figure 2A:
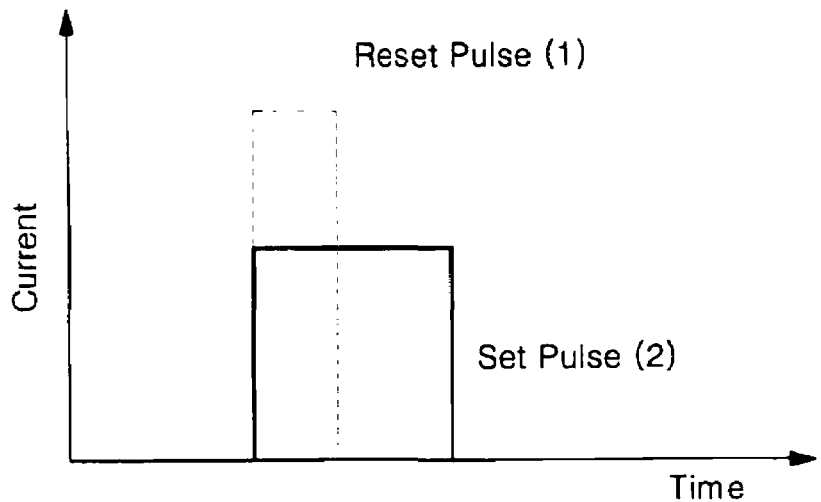
FIG. 2A illustrates the set and reset pulses applied in programming the memory cell of FIG. 1.
Figure 2B:
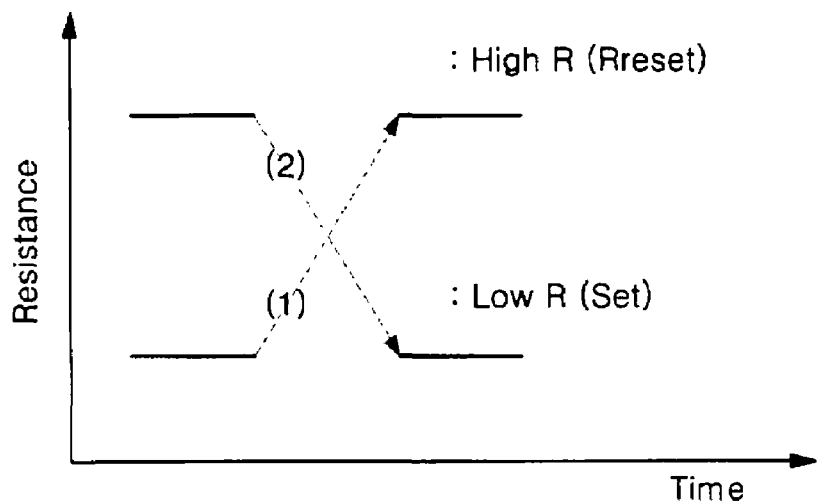
FIG. 2B illustrates the resistance state of the memory cell as a result of the pulses applied in FIG. 2A.
Figure 3:
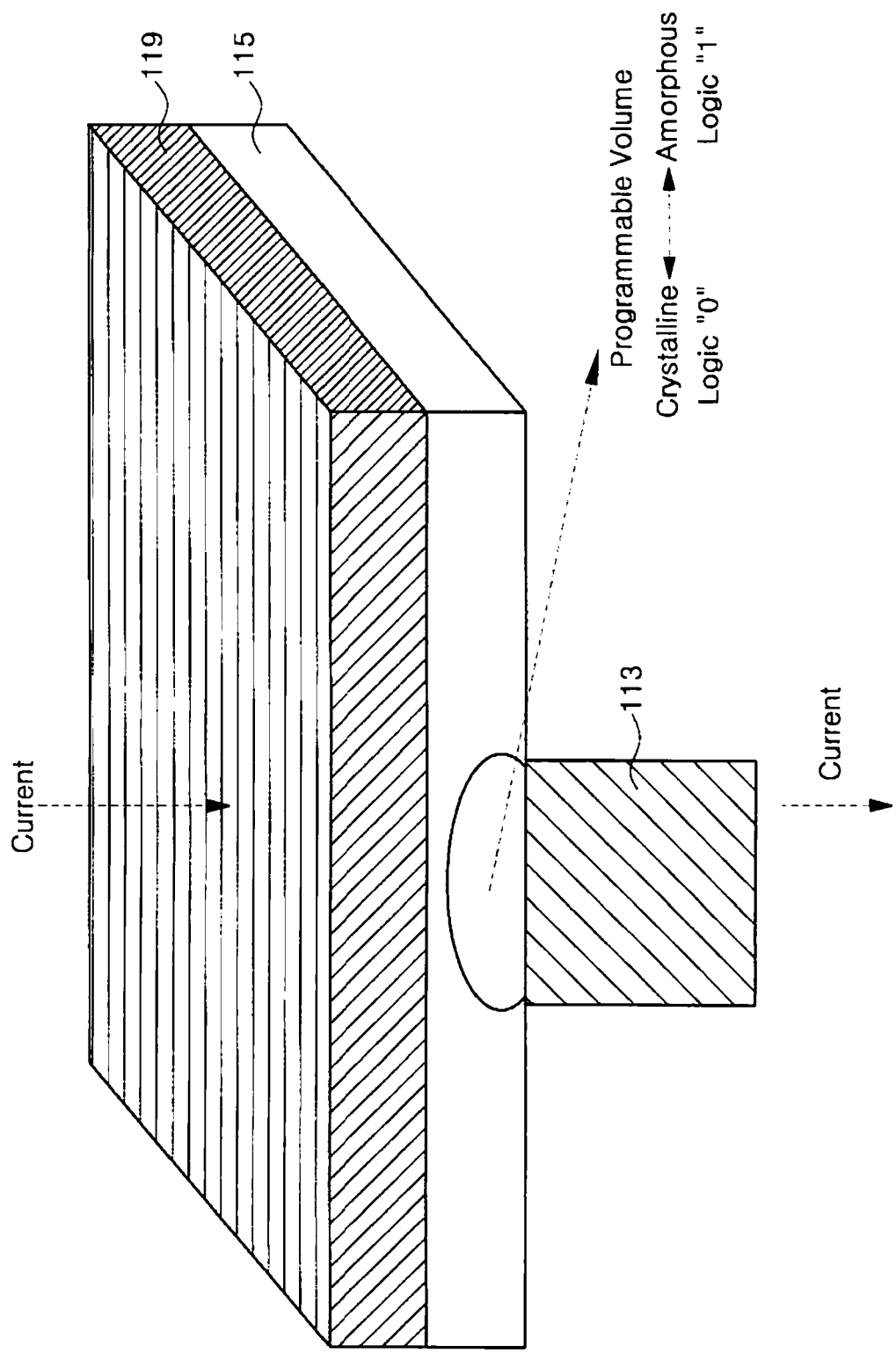
FIG. 3 illustrates the programmable volume of the phase change material in the memory cell of FIG. 1.

Prior to operation of a phase change memory device employing phase change memory cells such as shown in FIG. 1, a firing operation may be performed. A firing operation is an operation that generates heat in at least a portion of the phase change material, so that improvements result during later operations involving the phase change material. One example improvement according to the present invention is reduced reset current.

Figure 4:
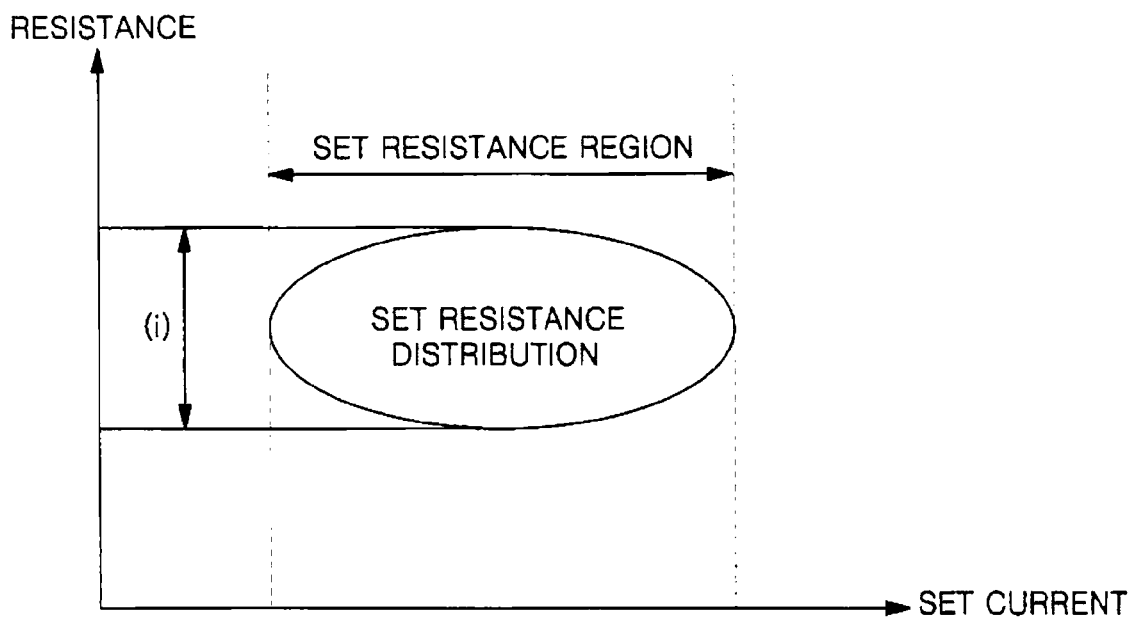
FIG. 4 is a diagram illustrating a set resistance distribution of a phase change material before it is subjected to a firing operation.

FIG. 4 is a view illustrating a set resistance distribution of a phase change material before it is subjected to the initial firing operation. Referring to FIG. 4, in the range (i), the set resistance values are widely distributed and the average set resistance value is high. Therefore, at the time of the read-out operation, defects may occur, and thus, the yield may be reduced.

Figure 5:
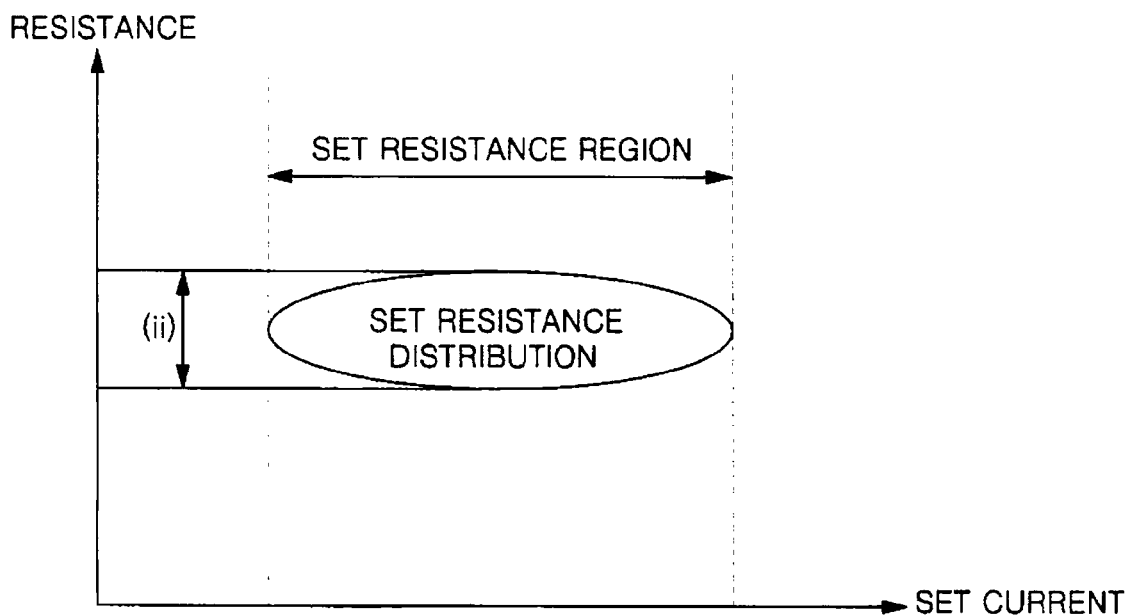
FIG. 5 is a diagram illustrating a set resistance distribution of a phase change material after it is subjected to a firing operation.

FIG. 5 is a view illustrating the set resistance distribution of a phase change material after it is subjected to the initial firing operation. Referring to FIG. 5, in the range (ii), the set resistance values are narrowly and uniformly distributed and the average set resistance value is lower than that of the phase change material before it is subjected to the initial firing operation. The initial firing operation is performed to provide a more stable read-out operation of the phase change memory device.

For the purposes of example only, the embodiments of the present invention will be described assuming that the phase change memory cells have the structure as shown in FIG. 1. However, it will be understood that any phase change memory cell structure may be used with the embodiments of the present invention.

Figure 6:
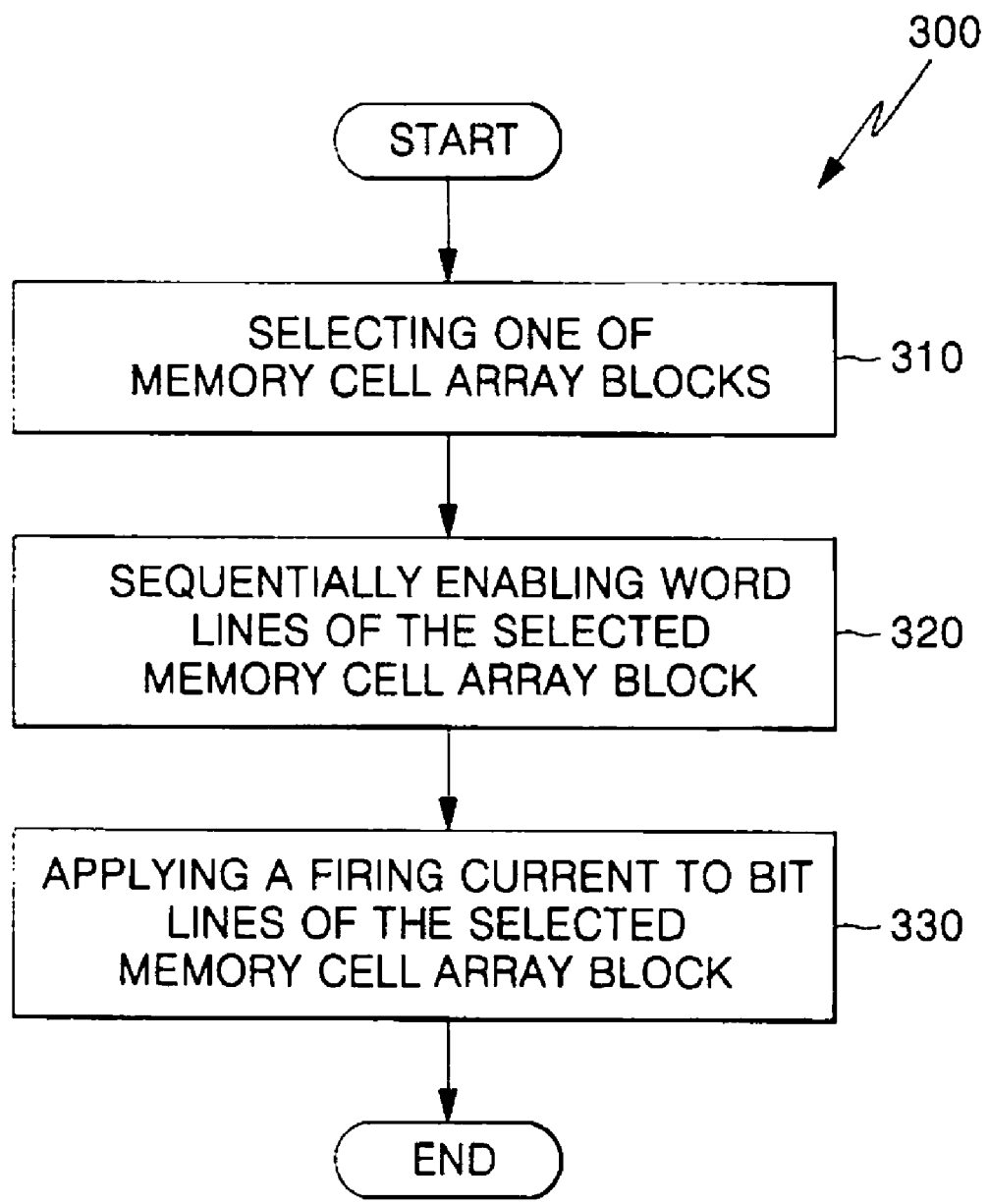
FIG. 6 is a flowchart illustrating a firing method according to an embodiment of the present invention.

FIG. 6 is a flowchart illustrating an initial firing method according to an embodiment of the present invention. Referring to FIG. 6, the initial firing method 300 of the phase change memory device having the phase change material, according to the embodiment of the present invention comprises a step 310 of selecting one of a plurality of memory array blocks: a step 320 of sequentially enabling word lines of the selected memory cell array block; and a step 330 of applying a firing current to bit lines of the selected memory cell array block. The firing current is larger than a reset current which allows the phase change material to be in a reset state.

Figure 7:
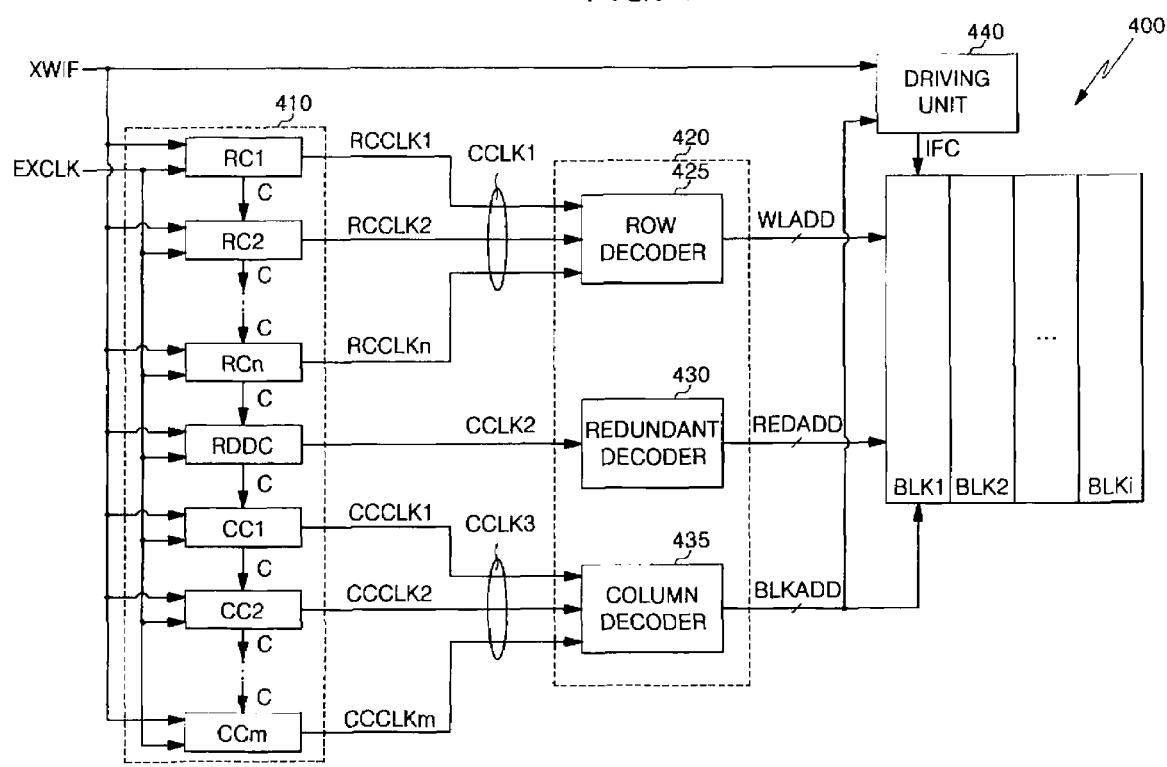
FIG. 7 is a block diagram illustrating a phase change memory device according to the present invention.

FIG. 7 is a block diagram illustrating one embodiment of the phase change memory device 400 according to the present invention. Referring to FIG. 7, the phase change memory device 400 comprises a plurality of memory cell array blocks BLK1, and BLK2 through BLKi, a counter clock generation unit 410, a decoding unit 420, and a driving unit 440. Each memory cell array block BLK1, and BLK2 through BLKi comprises phase change memory cells such as shown in FIG. 1. The counter clock generation unit 410 outputs first through third counter clock signals CCLK1, CCLK2, and CCLK3 in response to an external clock signal EXCLK and a firing mode signal XWIF, wherein the first through third counter clock signals CCLK1, CCLK2, and CCLK 3 have different cycles.

The decoding unit 420, in response to the first through third counter clock signals CCLK1, CCLK2, and CCLK3, outputs a block address BLKADD which selects one of the plurality of memory cell array blocks BLK1, and BLK2 through BLKi, a word line address WLADD, which enables word lines of the selected memory cell array block, and a redundant word line address REDADD which enables a redundant word line of the selected memory cell array block.

The driving unit 440 applies a firing current IFC to the memory cell array blocks BLK1, and BLK2 through BLKi in response to the firing mode signal XWIF.

The phase change memory device and the initial firing method according to the embodiment of the present invention will be described with reference to FIGS. 6 and 7. The memory cell array blocks BLK1, and BLK2 through BLKi in the phase change memory device 400 comprise a plurality of phase change memory cells (not shown). The counter clock generation unit 410 outputs the first through third counter clock signals CCLK1, CCLK2, and CCLK 3 in response to the external clock signal EXCLK and the firing mode signal XWIF, wherein the first through third counter clock signals CCLK1, CCLK2, and CCLK 3 have different cycles.

The external clock signal EXCLK, a clock signal having a cycle, is input from the exterior and activated only at the initial firing mode when the initial firing operation is performed. The firing mode signal XWIF is generated at the time that the phase change memory device 400 is at the initial firing mode.

The counter clock generation unit 410 comprises a plurality of counters. The outputs of the counters are decoded to sequentially select the memory cell array blocks BLK1, and BLK2 through BLKi, so that the initial firing operation can be performed.

The counter clock generation unit 410 comprises the first through n-th row counters RC1, and RC2 through RCn, the redundant counter RDDC, and the first through m-th counters CC1, and CC2 through CCm.

The first through n-th row counters RC1, and RC2 through RCn are turned on or off in response to the firing mode signal XWIF and generate the first through n-th row counter clock signals RCCLK1, and RCCLK2 through RCCLKN in response to the external clock signal EXCLK, wherein the first through n-th row counter clock signals RCCLK1, and RCCLK2 through RCCLKn constitute the first counter clock signal CCLK1.

The redundant counter RDDC is turned on or off in response to the firing mode signal XWIF and generates the second counter clock signal CCLK2 in response to the external clock signal EXCLK. The first through m-th column counters CC1, and CC2 through CCm are turned on or off in response to the firing mode signal XWIF and generate the first through m-th column counter clock signals CCCLK1, and CCCLK2 through CCCLKm in response to the external clock signal EXCLK, wherein the first through m-th column counter clock signals CCCLK1, and CCCLK2 through CCCLKm constitute the third counter clock signal CCLK3.

The second through n-th row counters RC2 through RCn are sequentially operated in response to the carry C output from the previous row counter. The redundant counter RDCC is operated in response to the carry C output from the n-th row counter RCn. The first column counter CC1 is operated in response to the carry C output from the redundant counter RDDC. The second to m-th column counters CC2 through CCm are sequentially operated in response to the carry output C from the previous column counter.

Figure 9:
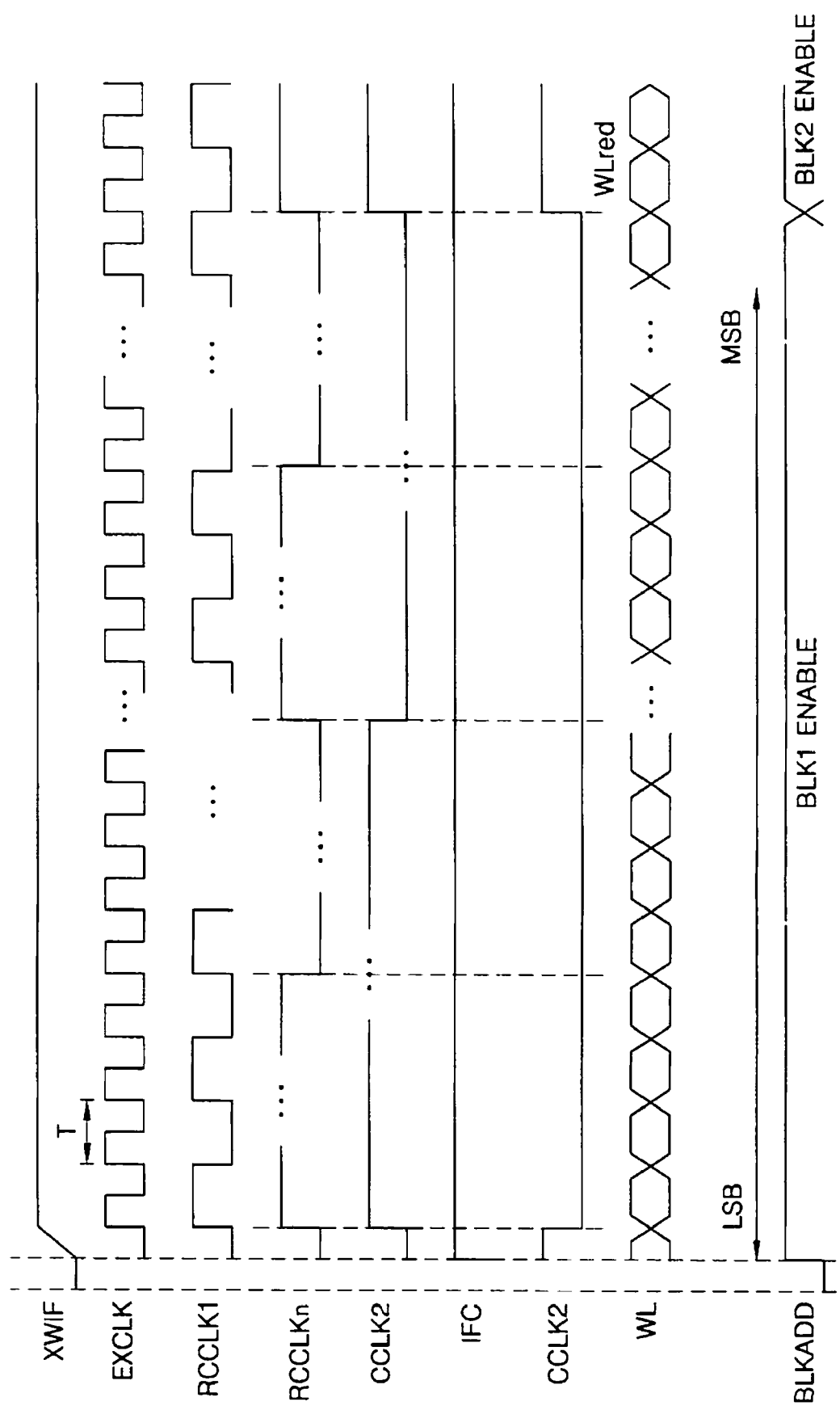
FIG. 9 is a timing diagram illustrating operation of the phase change memory device of FIG. 7.

The operation of the counter clock generation unit 410 will be described in detail with reference to the timing diagram of FIG. 9. FIG. 9 is a timing diagram illustrating operations of the phase change memory device of FIG. 7.

The first through n-th row counters RC1, and RC2 through RCn, the redundant counter RDDC, and the first through m-th column counters CC1, and CC2 through CCm perform their own counting operations in response to the external clock signal EXCLK and the firing mode signal XWIF. If the firing mode signal XWIF is disabled, counters of the counter clock generation unit 410 are also turned off. In addition, the second row counter RC2 is operated in response to the carry C generated by the first row counter RC1. The third row counter RC3 is operated in response to the carry C generated by the second row counter RC2. The redundant counter RDDC is operated in response to the carry C generated by the n-th row counter RCn. The first column counter CC1 is operated in response to the carry C generated by the redundant counter RDDC. Similarly, the m-th column counter CCm is operated in response to the carry C generated by the (m−1)-th column counter (not shown). In this manner, the counters of the counter clock generation unit 410 are sequentially operated.

As shown in FIG. 9, cycles of the signals generated from the counters of the counter clock generation unit 410 are sequentially doubled. That is, the cycles of the first through n-th row counter clock signals RCCLK1, and RCCLK2 through RCCLKn output from the first through n-th row counters RC1, and RC2 through RCn are sequentially doubled. The cycle of the second counter clock signal CCLK2 output from the redundant counter RDDC is twice as long as that of the n-th row counter clock signal RCCLKn output from the n-th row counter RCn. The cycle of the first column counter clock signal CCCLK1 output from the first column counter CC1 is twice as long as that of the second counter clock signal CCLK2 output from the redundant counter RDDC. Similarly, the cycles of the second to m-th counter clock signals CCCLK2 through CCCLKm are sequentially doubled. Accordingly, the first through third counter clock signals CCLK1, CCLK2, and CCLK3 are sequentially generated. The first through third counter clock signals CCLK1, CCLK2, and CCLK3 are input to the decoding unit 420.

The decoding unit 420, in response to the first through third counter clock signals CCLK1, CCLK2, and CCLK3, outputs the block address BLKADD which selects one of the plurality of memory cell array blocks BLK1, and BLK2 through BLKi, the word line addresses WLADD, which enables word lines of the selected memory cell array block, and the redundant word line address REDADD, which enables a redundant word line of the selected memory cell array block. The decoding unit 420 comprises a row decoder 425, a redundant decoder 430, and a column decoder 435. The row decoder 425 outputs the word line addresses WLADD, which are sequentially enabled in response to the first counter clock signal. That is, the row decoder 425 receives and decodes the first through n-th row counter clock signals RCCLK1, and RCCLK2 through RCCLKn having different cycles and outputs the decoding results as the word lines addresses WLADD. The word line addresses WLADD sequentially enable word lines of the selected memory cell array block from the least significant bit to the most significant bit.

The redundant decoder 425 outputs the redundant word line address REDADD in response to the second counter clock signal CCLK2. The column decoder 435 outputs the block address BLKADD, which selects one of the plurality of memory cell array blocks BLK1, and BLK2 through BLKi in response to the third counter clock signal CCLK3. The column decoder 435 receives and decodes the first through m-th column counter clock signals CCCLK1, and CCCLK2 through CCCLKm having different cycles, and outputs the decoding results as the block address BLKADD. The block address BLKADD enables all the bit lines of the selected memory cell array block. Various types of structures of the decoding unit 420 for receiving and decoding the clock signals output from the counter clock generation unit 410 may be employed.

Figure 8:
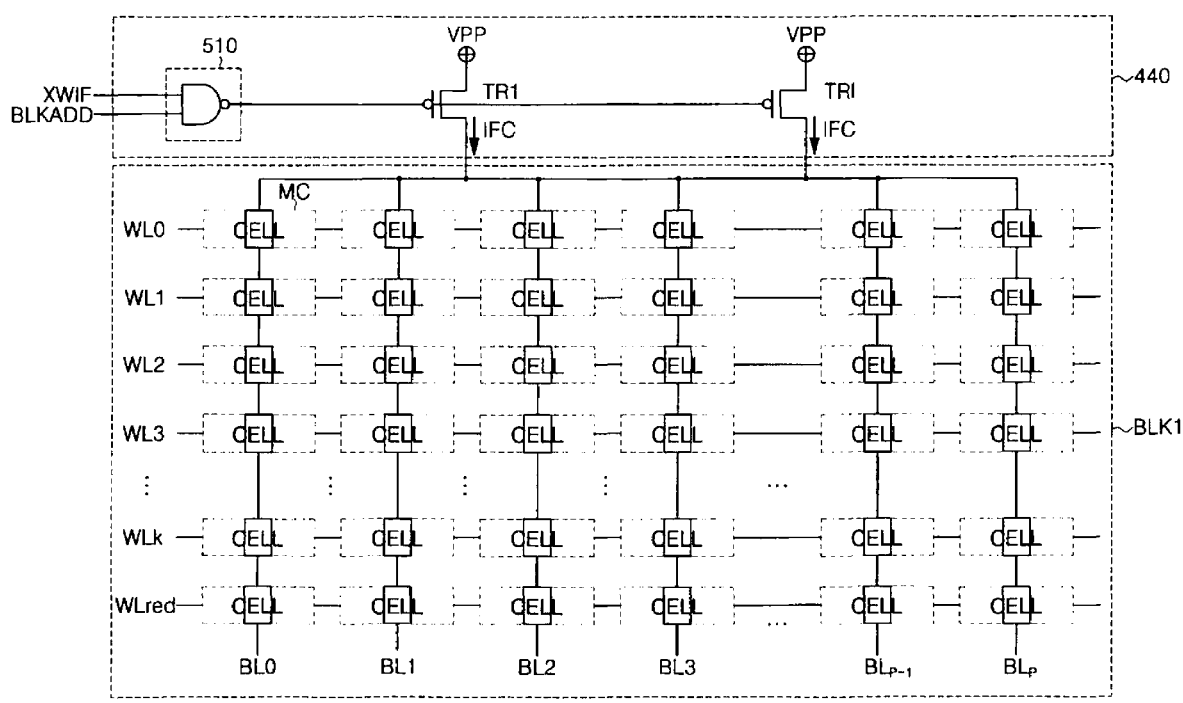
FIG. 8 is a schematic diagram illustrating a driving unit of FIG. 7.

The driving unit 440 applies a firing current IFC to the memory cell array blocks BLK1, and BLK2 through BLKi in response to the firing mode signal XWIF. The operation of the driving unit 400 will be described with reference to FIG. 8. FIG. 8 is a block diagram illustrating the driving 440 unit of FIG. 7. Referring to FIG. 8, the driving unit 440 comprises a plurality of transistors TR1 through TR1. Each transistor has a first terminal connected to a firing voltage VPP, a second terminal connected to the bit lines BL0, and BL1 through BLp of the memory cell array blocks BLK1, and BLK2 through BLKi, and a gate connected to the firing mode signal XWIF. Each of the transistors TR1 through TR1 has such suitable size that the firing current IFC can be applied to the bit lines BL0, and BL1 through BLp.

FIG. 8 illustrates only the first memory cell array block BLK1 having (k+1) word lines, (p+1) bit lines, and one redundant word line WLred.

At the initial firing operation, the first memory cell array block BLK1 is automatically selected by the block address BLKADD. The row decoder 425, which receives the clock signal CCLK1, outputs the word line addresses WLADD to sequentially enable the word lines WL0, and WL1 through WLk of the first memory cell array block BLK1. Namely, the first word line WL0 is enabled first. The driving unit 440 applies the firing current IFC to the bit lines BL0, and BL1 through BLp of the first memory cell array block BLK1. The initial firing operation is then performed on the phase change materials of the memory cells that are connected to the first word line WL0.

Next, the first word line WL0 is disabled and the second word line WL1 is enabled. The initial firing operation is then performed on the phase change materials of the memory cells that are connected to the second word line WL0. Similarly, the initial firing operations are performed on the phase change materials of the memory cells which are connected to the k-th word line WLk and the redundant word line WLred. As a result, the initial firing operation on the first memory cell array block is completed. Since the first through n-th row counters RC1, and RC2 through RCn and the redundant counter RDDC of the counter clock generation unit 410 are sequentially operated to sequentially output the first through n-th row counter clock signals RCCLK1, and RCCLK2 through RCCLKn and the second counter clock signal CCLK2, the first through k-th word lines WL0, and WL1 through WLk and the redundant word line WLred are sequentially enabled.

If the redundant word line WLred is disabled, the column decoder 435 outputs the block address BLKADD by the operations of the first through m-th column counters CC1, and CC2 through CCm, and the block address BLKADD selects the second memory cell array block BLK2. This can be seen in the timing diagram of FIG. 9. If the second memory cell array block BLK2 is selected, the first through n-th word lines (not shown) and the redundant word, line (not shown) are sequentially enabled, and the firing operation is performed.

The firing voltage VPP may be equal to or higher than a power supply voltage. The voltage level may be increased or decreased in consideration of the number of connected memory cell arrays. The firing voltage VPP will be discussed in greater detail below with respect to further embodiments of the present invention. The firing current IFC is larger than the reset current, and will also be discussed in greater detail below with respect to further embodiments of the present invention.

The driving unit 440 may further comprises a control unit 510, which controls the firing current IFC to be applied to only the bit lines of the phase change memory cell array, which are selected by the block address BLKADD, in response to the block address BLKADD and the firing mode signal XWIF. Since the firing current IFC is applied to only the selected memory cell array blocks, the firing operation is performed more accurately. The control unit 510 may be a NAND gate. The output of the NAND gate is at a low level and the transistors TR1 through TR1 are turned on, only when both the block address BLKADD and the firing mode signal XWIF are enabled to be at high levels. Although they are illustrated as PMOS transistors, the transistors TR1 through TR1 need not be PMOS transistors.

In the phase change memory device 400 according to the present invention, since the externally input signals are reduced as the external clock signal EXCLK, the firing mode signal XWIF, the firing voltage VPP, the power supply voltage and the ground voltage, a large number of chips on a single wafer can be simultaneously tested.

The inventors of the present application have discovered that when in the crystalline state, the phase change material is a mixture of the hexagonal closed packed (HCP) crystalline structure and the face centered cubic (FCC) crystalline structure. The FCC crystalline structure provides a higher resistance than that of the HCP crystalline structure—about two orders of magnitude greater. However, the inventors have discovered that a much greater amount of energy is required to convert the HCP crystalline structure to the amorphous phase than the energy required to convert the FCC crystalline structure to the amorphous phase. Stated another way, the FCC state is a more favorable crystalline-to-amorphous transition state than the HCP because the FCC state more easily transitions from the crystalline state to the amorphous state.

The inventors have further discovered that by applying a sufficiently high firing current or temperature, the phase change material or a portion thereof (e.g., the programmable volume) may be changed to either the amorphous phase or the FCC crystalline phase. Furthermore, the inventors have discovered that subsequent to this firing, the programmable volume of the phase change material will achieve the FCC crystalline state when set. As a result, the inventors have further discovered that by properly choosing the firing current, they can reduce the reset current required to achieve the reset state. This firing also reduces the resistance of the set state, but provides a greater margin between the set and reset resistances than existed prior to firing.

Figure 10A:
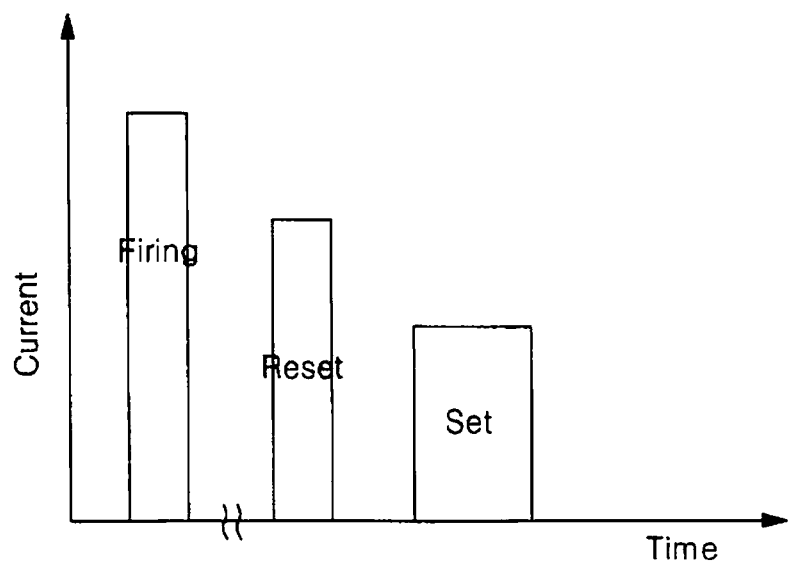
FIGS. 10A and 10B illustrate embodiments of the firing current applied to the phase change material according to the present invention.

FIG. 10A illustrates one embodiment of the firing current applied according to the present invention. The application of the firing current may be performed as in the above-described embodiments. As shown, by applying a relatively high current pulse, the phase change material is converted to the amorphous phase after firing. As further shown in FIG. 10A, this results in a much lower required reset current during future operation.

Figure 10B:
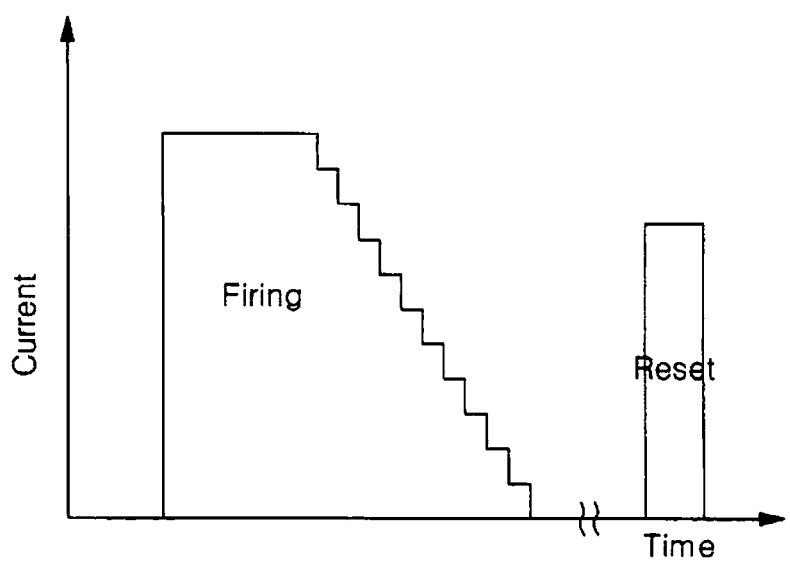

FIG. 10B illustrates another embodiment of the present invention. In this embodiment, the same high firing current is applied but then is stepped down over time. As a result of this firing operation, the phase change material is converted to the high resistance FCC crystalline state. However, the same effects are achieved; namely, the same low reset current and low set resistance state are achieved.

Figure 11:
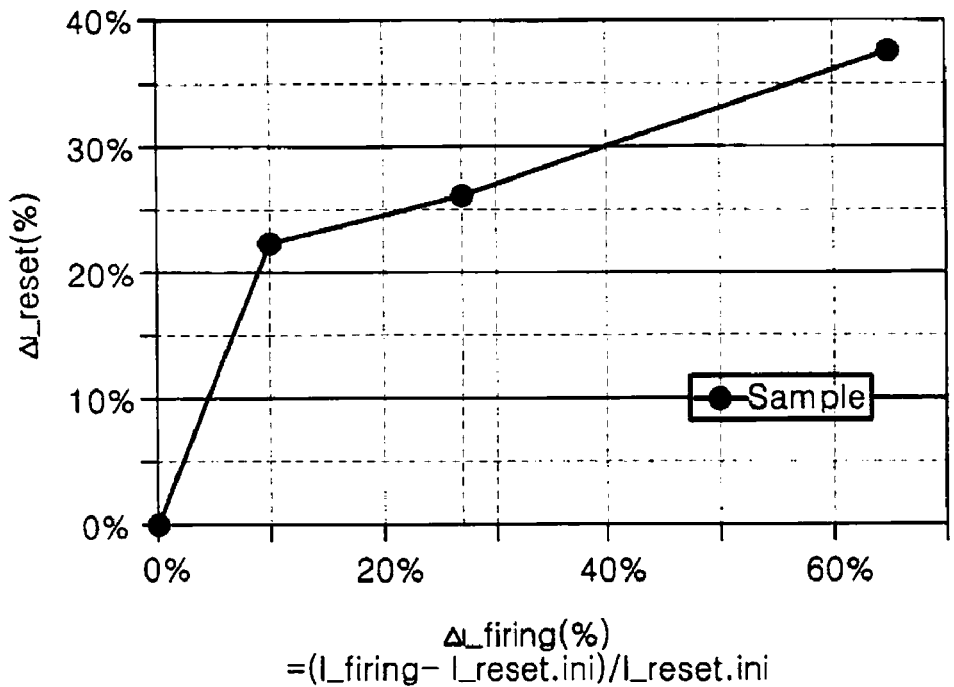
FIG. 11 illustrates the percentage change in reset current with respect to the percentage change in firing current.

FIG. 11 further illustrates the effect of firing current on the reset current. More particularly, this figure shows the percentage decrease in the reset current with respect to the percentage increase of the firing current with respect to the initial pre-firing reset current. Here, the reset pulse width was set at 500 nanoseconds, which is consistent with the embodiment of FIG. 10A. That is, the firing causes the phase change material to achieve the amorphous phase. As shown, as the reset current is increased above the initial pre-firing reset current, the post-firing reset current decreases. More particularly, when the firing current is increased to 10% to 20% (e.g., 1.1 to 1.2 times the initial reset current) or more of the initial reset current, a significant decrease in the reset current is achieved.

Figure 12:
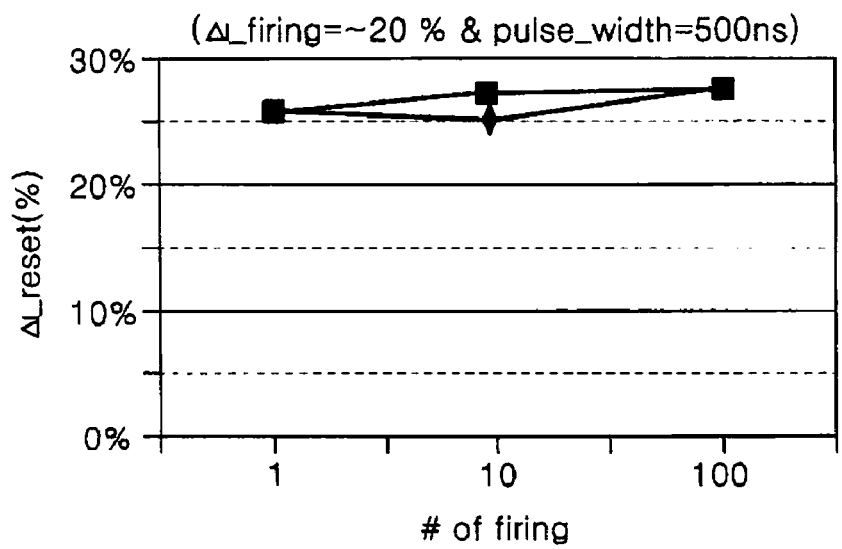
FIG. 12 illustrates the effect the number of firing operations has on the reset current.

FIG. 12 illustrates the effect the number of firings has on the reset current. For a firing current 20% greater than the initial pre-firing reset current (e.g., 1.2. times the initial reset current), and a pulse width of 500 nanoseconds (obtaining the amorphous phase after firing). FIG. 12 illustrates the change in reset current for a number of such firings. As shown, this figure illustrates that the reset current is not greatly affected by conducting multiple firings.

Figure 13:
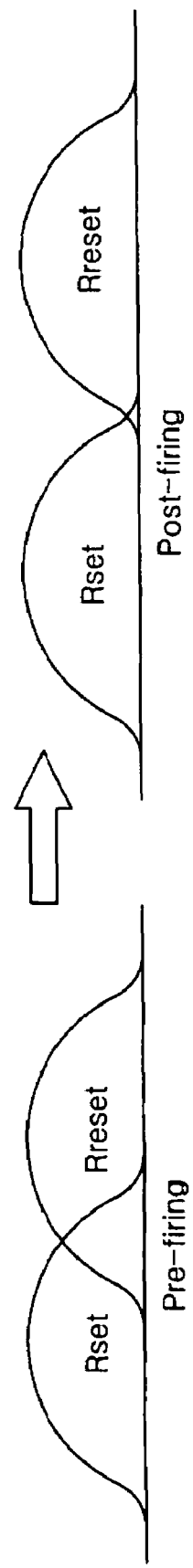
FIG. 13 illustrates the effect the firing operation has on the difference in resistance between the set and reset states.

FIG. 13 illustrates the effect of firing according to the present invention on the resistance margin between the reset and set states. The left hand side of FIG. 13 illustrates the resistance distribution for the reset and set states prior to firing. The right hand side of FIG. 13 illustrates the set and reset resistance distributions after firing. As shown in FIG. 13, prior to firing, the set and reset distributions substantially overlap. As a result, memory defects may occur. By contrast, after firing, a much greater margin exists between the set and reset distributions such that the number of memory defects significantly decreases.

Figure 14A:
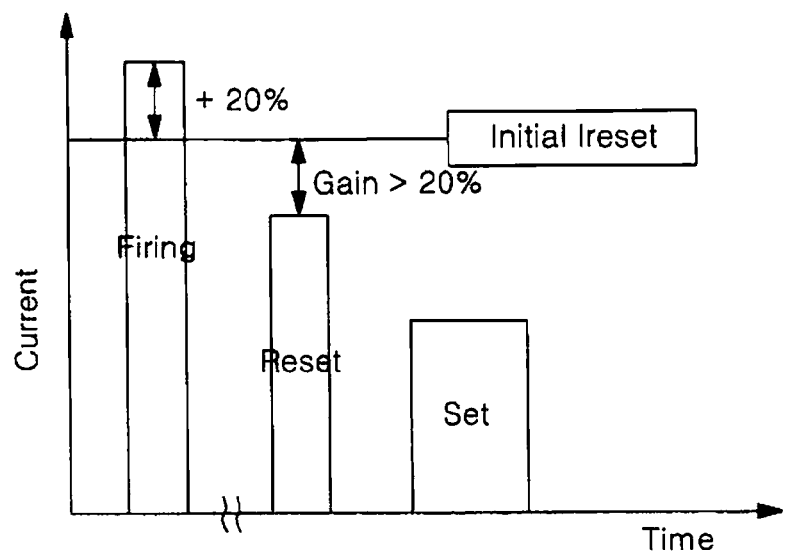
FIGS. 14A and 14B illustrate specific examples of the impact firing has on the reset current.
Figure 14B:
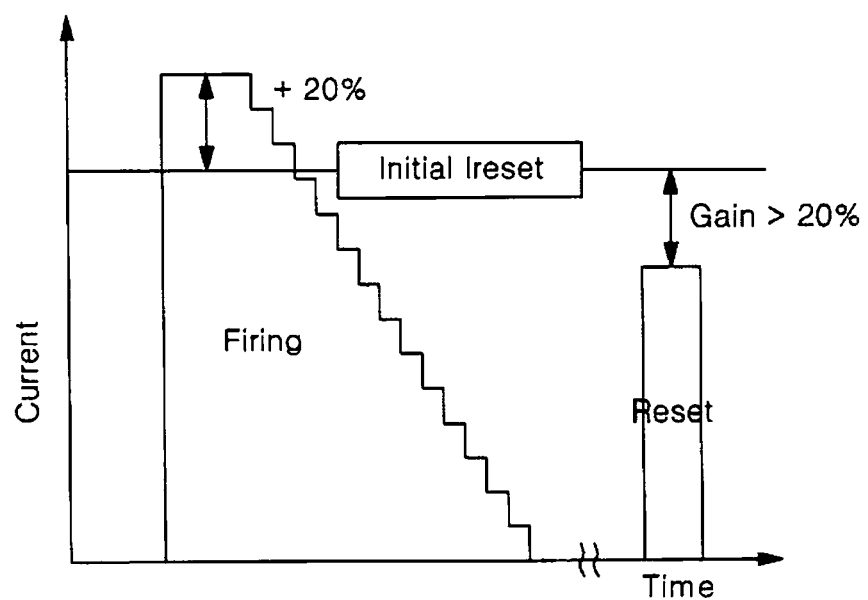

FIGS. 14A and 14B illustrate two example cases of the improvements resulting from the firing process according to these present invention. FIG. 14A illustrates the case where the firing obtains the amorphous phase, and FIG. 14B illustrates the case where the firing obtains the FCC crystalline state. As shown, in the example embodiments, a firing current of 20% greater than the initial reset current (e.g., 1.2 times the initial reset current) was chosen for the examples of FIG. 14A and FIG. 14B. These figures further show that the reduction in the reset current was greater than 20% as would be expected from examining FIG. 11.

Figure 15:
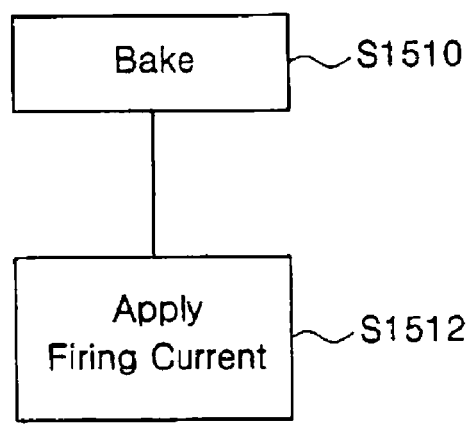
FIG. 15 illustrates another example embodiment of firing according to the present invention.

FIG. 15 illustrates another embodiment according to the present invention. As shown, in step S1510, the semiconductor memory device is baked at a temperature and for a period of time such that the phase change material achieves the HCP crystalline state. For example, the temperature is below a melting temperature of the phase change material. In this embodiment, both the programmable volume and the remaining portion of the phase change material obtain the HCP crystalline state. Next, in step S1512, the firing current is applied according to the embodiment shown in FIG. 10B such that the programmable volume achieves the FCC crystalline state. It will be understood that the remaining portion of the phase change material remains in the HCP crystalline state.

Figure 16:
FIG. 16 illustrates a further example embodiment of the firing operation according to the present invention.

FIG. 16 illustrates yet another embodiment of the present invention. The previous embodiments achieved the firing operation by the application of a current to the phase change material. As stated previously, application of the current achieves application of heat. Instead of using current to apply heat to the phase change material, heat may be more directly applied. For example, FIG. 16 shows that in step S1610, a rapid thermal annealing process is carried out on the semiconductor device including the phase change memory cells. The rapid thermal annealing is carried out at a sufficient temperature and for a sufficient period of time in order to change the phase change material to the amorphous state. For example, the temperature is greater than a melting temperature of the phase change material.

As discussed above, the present invention provides a method for significantly reducing the reset current for a phase change memory cell. In addition, the present invention provides the added benefit of increasing the difference in resistance between the set and reset states of the phase change memory cell.

The invention being thus described, it will be obvious that the same may be varied in many ways. Such variations are not to be regarded as a departure from the invention, and all such modifications are intended to be included within the scope of the invention.

The invention claimed is:

1. A method of reducing a reset current for resetting a portion of phase change material in a memory cell of a phase change memory device, comprising:

performing an initial firing operation to convert at least the portion of the phase change material including a first crystalline phase to one of a second crystalline phase and an amorphous phase, the second crystalline phase transitioning to the amorphous phase more easily than the first crystalline phase; and applying the reset current for resetting at least the portion of the phase change material after the performing the initial firing operation step.

2. The method of claim 1, wherein the first crystalline phase has hexagonal closed packed structure.

3. The method of claim 2, wherein the second crystalline phase has a face centered cubic structure.

4. The method of claim 1, wherein the second crystalline phase has a face centered cubic structure.

5. The method of claim 1, wherein the initial firing operation performs a heat treatment to convert the first crystalline phase to one of the second crystalline phase and the amorphous phase.

6. The method of claim 1, wherein the initial firing operation applies a current to the phase change material.

7. The method of claim 6, wherein the applied current is greater than the reset current if the initial firing operation was not performed.

8. The method of claim 7, wherein the applied current is greater than or equal to 1.1 times the reset current if the initial firing operation was not performed.

9. The method of claim 7, wherein as the applied current increases, the reset current after the initial firing operation decreases.

10. The method of claim 7, wherein the initial firing operation applies a current such that the reset current after the converting step is at least 20% less than the reset current before the converting step.

11. The method of claim 7, wherein the initial firing operation applies a current having a pulse width such that the first crystalline phase converts to the amorphous phase.

12. The method of claim 7, wherein the initial firing operation applies a current having a pulse width such that the first crystalline phase converts to the second crystalline phase.

13. The method of claim 1, wherein the first crystalline phase has a lower resistance than the second crystalline phase.

14. A method of reducing a reset current for resetting a portion of phase change material in a memory cell of a phase change memory device, comprising:

performing an initial firing operation to convert at least the portion of the phase change material in a mixed phase state to a single phase state; and applying the reset current for resetting at least the portion of the phase change material after the performing the initial firing operation step.

15. The method of claim 14, wherein the initial firing operation converts at least the portion of the phase change material in a mixed crystalline phase state to a single phase state.

16. The method of claim 15, wherein the single phase state is an amorphous phase.

17. The method of claim 15, wherein the single phase state is a single crystalline phase.

18. A method of reducing a reset current for resetting a portion of phase change material in a memory cell of a phase change memory device to an amorphous phase, comprising:

applying an initial firing current to the phase change material; and applying the reset current for resetting the portion of phase change material after the applying the initial firing current step, wherein the reset current of the phase change material after the applying the initial firing current step is less than a reset current before the applying the initial current step.

19. The method of claim 18, wherein the applying the initial firing current step applies a current such that a set resistance, which is the resistance of the portion of the phase change material if set to a crystalline phase, after the applying step is less than the set resistance before the applying step.

20. The method of claim 18, wherein the applying the initial firing current step applies a current such that a margin between a set resistance and a reset resistance increases, the set resistance is the resistance of the portion of the phase change material if set to a crystalline phase and the reset resistance is the resistance of the portion of the phase change material if set to an amorphous phase.

21. A method of reducing a reset current for resetting a portion of phase change material in a memory cell of a phase change memory device to an amorphous phase, comprising:

performing a heat treatment on the phase change memory device;

applying the reset current for resetting the portion of phase change material after the performing the heat treatment step, wherein the reset current of the phase change material after the performing the heat treatment step is less than a reset current before the performing the heat treatment step.

22. A method of improving operation a phase change memory device including at least one memory cell having phase change material, comprising:

treating the phase change material such that an energy required to change a portion of the phase change material from a crystalline phase to an amorphous phase is reduced; and applying a rest current for resetting a portion of phase change material after the treating step.

* * * * *

UNITED STATES PATENT AND TRADEMARK OFFICE
CERTIFICATE OF CORRECTION

PATENT NO. : 7,606,064 B2  Page 1 of 1
APPLICATION NO. : 11/420933
DATED : October 20, 2009
INVENTOR(S) : Jeong et al.

It is certified that error appears in the above-identified patent and that said Letters Patent is hereby corrected as shown below:

On title page, please add:

Item (30)   Foreign Application Priority Data: Sep. 8, 2003 (KR) ................2003-62546

Item (63)   Related U.S. Application Data: Continuation-in-part of U.S. Application No. 10/929,511, filed on Aug. 30, 2004, now U.S. Patent No. 7,254,055.

Signed and Sealed this

Ninth Day of November, 2010

David J. Kappos
*Director of the United States Patent and Trademark Office*